United States Patent [19]

Ong

[11] Patent Number: 5,880,041
[45] Date of Patent: Mar. 9, 1999

[54] METHOD FOR FORMING A DIELECTRIC LAYER USING HIGH PRESSURE

[75] Inventor: T. P. Ong, Austin, Tex.

[73] Assignee: Motorola Inc., Schaumburg, Ill.

[21] Appl. No.: 249,608

[22] Filed: May 27, 1994

[51] Int. Cl.$^6$ ................................................. H01L 21/316
[52] U.S. Cl. .................... 438/773; 427/255.3; 427/255.4
[58] Field of Search .................................. 437/239, 242; 427/255, 255.3, 255.4; 438/770, 773, 769

[56] References Cited

U.S. PATENT DOCUMENTS

| | | | |
|---|---|---|---|
| 4,136,434 | 1/1979 | Thibault et al. | 29/571 |
| 4,139,658 | 2/1979 | Cohen et al. | 427/93 |
| 4,268,538 | 5/1981 | Toole et al. | 427/93 |
| 4,275,093 | 6/1981 | Sasaki et al. | 427/89 |
| 4,372,033 | 2/1983 | Chiao | 29/571 |
| 4,376,796 | 3/1983 | Arrasmith et al. | 427/82 |
| 4,599,247 | 7/1986 | Bean et al. | 427/93 |
| 4,794,443 | 12/1988 | Tanaka et al. | 357/43 |
| 4,855,160 | 8/1989 | Luttmer et al. | 427/38 |
| 4,906,595 | 3/1990 | Van Der Plas et al. | 437/239 |
| 5,145,795 | 9/1992 | Sanders et al. | 437/33 |
| 5,167,716 | 12/1992 | Boitnott et al. | 118/719 |
| 5,219,773 | 6/1993 | Dunn | 437/42 |
| 5,268,587 | 12/1993 | Murata et al. | 257/357 |
| 5,376,560 | 12/1994 | Aronowitz et al. | 437/24 |
| 5,433,168 | 7/1995 | Yonehara | 117/90 |

FOREIGN PATENT DOCUMENTS

| | | | |
|---|---|---|---|
| 60-107840 | 6/1985 | Japan . | |
| 4-75354 | 3/1992 | Japan | 437/239 |

OTHER PUBLICATIONS

Wolf, Stanley "Silicon Processing for the VLSI Era", vol. 1, pp. 215–218, 639–641.

Sing Pin Tay et al., "High Pressure Technology for Silicon IC Fabrication," Semiconductor Int'l, May 1986, pp. 122–127.

R.J. Zeto et al., "Pressure Oxidation of Silicon: An Emerging Technolgy," Solid State Technology, Jul. 1979, pp. 62–69.

Liang N. Lie et al., "High Pressure Oxidation of Silicon in Dry Oxygen," J. Electrochem. Soc.: Solid–State Science and Technology, Dec. 1982, pp. 2828–2834.

Robert Champagne et al., "High–Pressure Pyrogenic Oxidation in the Production Environment," Solid State Technology, Dec. 1977, pp. 61–63.

L.E. Katz et al., "High Pressure Oxidation of Silicon by the Pyrogenic or Pumped Water Technique," Solid State Technology, Dec. 1981, pp. 87–93.

E.A. Irene, "The Effects of Trace Amounts of Water on the Thermal Oxidation of Silicon in Oxygen," J. Electro. Soc.: Solid–State Science and Technology, Dec. 1974, pp. 1613–1616.

David R. Craven et al., "The Silicon Oxidation Process–Including High Pressure Oxidation," Semiconductor International, Jun. 1981, pp. 59–74.

Chih–Yuan Lu et al., "High–Performance Salicide Shallow–Junction CMOS Devices for Submicrometer VLSI App. in Twin–Tub VI," IEEE Trans. on Electr. Dev., vol. 36 No. 11, Nov. 89, pp. 2530–2536.

"Vertical High–Pressure Furnace System," Solid State Technology, Jul. 1993, as provided by GaSonics.

Primary Examiner—Charles L. Bowers, Jr.
Assistant Examiner—Matthew Whipple

[57] ABSTRACT

A method for forming a dielectric layer on a surface of a substrate uses high pressure. A pressure vessel of a high pressure oxidation equipment is heated to a predetermined temperature. The substrate is placed inside the pressure vessel. The pressure vessel is pressurized to a pressure above atmospheric pressure. A flow of an oxidizing gas and a flow of steam are introduced into the pressure vessel, wherein the steam flow is only a fraction of the oxidizing gas flow. The dielectric layer on the surface is formed through an oxidizing reaction of the oxidizing gas and steam with the surface of the substrate, wherein the flow of steam acts in a catalytic-like manner to parabolicly accelerate the oxidizing reaction at the surface.

20 Claims, 2 Drawing Sheets

METHOD FOR FORMING A DIELECTRIC LAYER USING HIGH PRESSURE

FIELD OF THE INVENTION

The present invention relates generally to a method forming a dielectric layer at high pressure, and more specifically to forming a high pressure oxidation layer using a dilute steam process.

BACKGROUND OF THE INVENTION

Silicon oxidation plays an important role in the manufacturing of semiconductor devices. The thermal oxidation of silicon produces a silicon dioxide ($SiO_2$) passivation film with excellent electrical properties and is thus an important processing step during wafer fabrication. There are two known methods for thermal oxidation. The first is a standard 1 atmosphere (atm) oxidation using steam as the oxidant. This process requires a high processing temperature, in excess of 1000° C., and a long oxidation time, approximately 5 hours, for an oxidation thickness of 1 μm (10,000 Å). An inherent problem with the conventional 1 atm oxidation process is the thermal budget management for sub-micron devices. The thermal budget is a function of the oxidation time and temperature, a 1 atm oxidation process may result in the semiconductor device exceeding its thermal budget.

A second method uses high pressure to accelerate the oxide growth on the silicon substrate. The high pressure oxidation (HiPOx) process utilizes either pure steam or dry oxygen as the oxidant. One advantage of using elevated pressures is that the processing temperature may be lowered as compared to the conventional 1 atm oxidation process. In the pure steam HiPOX process, the oxidation rate increases parabolicly with increased pressure. As can be seen in FIG. 1, the oxidation time, at a same temperature, for a 1 μm thick oxide in a conventional 1 atm steam process is an order of magnitude larger than oxidation times for either a 10 atm or 25 atm pure steam HiPOx process.

A problem with the pure steam HiPOx process is that the oxidation time is too fast when the desired oxide thickness is less than 1 μm. The process becomes unmanufacturable and uncontrollable because the oxidation completes during the transient or ramp-up time of the HiPOx equipment. It is thus, not possible, to control either the desired oxide thickness or the material properties of the oxide. A second problem with the pure steam HiPOx process is that dirty particles are generated during the oxidation. The particles are caused by the superheated steam impinging on the quartz process tube or other parts made of quart inside the equipment. The generated particles increase film defectivity which is detrimental to semiconductor devices, and thus decrease device yield. A third problem with the pure steam HiPOx process is the Kooi effect typically observed in LOCOS isolation. In this instance, the adjacent underlying substrate is a masking nitride instead of silicon. The steam diffuses through the nitride to form ammonia at the nitride / pad oxide interface during the oxidation process. Then the ammonia diffuses through the pad oxide to form silicon nitride spots at the pad oxide / silicon interface resulting in a pitted active region which causes a device reliability problem.

An alternative HiPOx process utilizes dry oxygen as the oxidant. The dry oxygen process poses no dirty particle generation problem but the oxide growth rate is 2 orders of magnitude slower than that of the pure steam process, as illustrated in FIG. 2. While this dry oxygen HiPOx process is controllable because the oxidation completes after the equipment has reached steady state operation conditions, the process offers no gain in the thermal budget due to the extremely long process time. In fact, the dry oxygen HiPOx process takes the same amount of time to grow a given oxide thickness as a conventional 1 atm steam oxidation process. So while the processing temperature may be lowered slightly by going to high pressure in a dry oxygen environment, no advantage in processing time is gained.

Thus, it is desirable to find a dean oxidation process which offers a low thermal budget.

SUMMARY OF THE INVENTION

An embodiment of the present invention provides a method for forming a dielectric layer on a surface of a substrate using high pressure. A pressure vessel of a high pressure oxidation equipment is heated to a predetermined temperature. The substrate is placed inside the pressure vessel. The pressure vessel is pressurized to a pressure above atmospheric pressure. A flow of an oxidizing gas and a flow of steam are introduced into the pressure vessel. The dielectric layer on the surface is formed through an oxidizing reaction of the oxidizing gas and steam with the surface of the substrate, wherein the flow of steam acts in a catalytic-like manner to parabolicly accelerate the oxidizing reaction at the surface.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

DETAILED DESCRIPTION OF A PREFERRED EMBODIMENT

Figure 1:
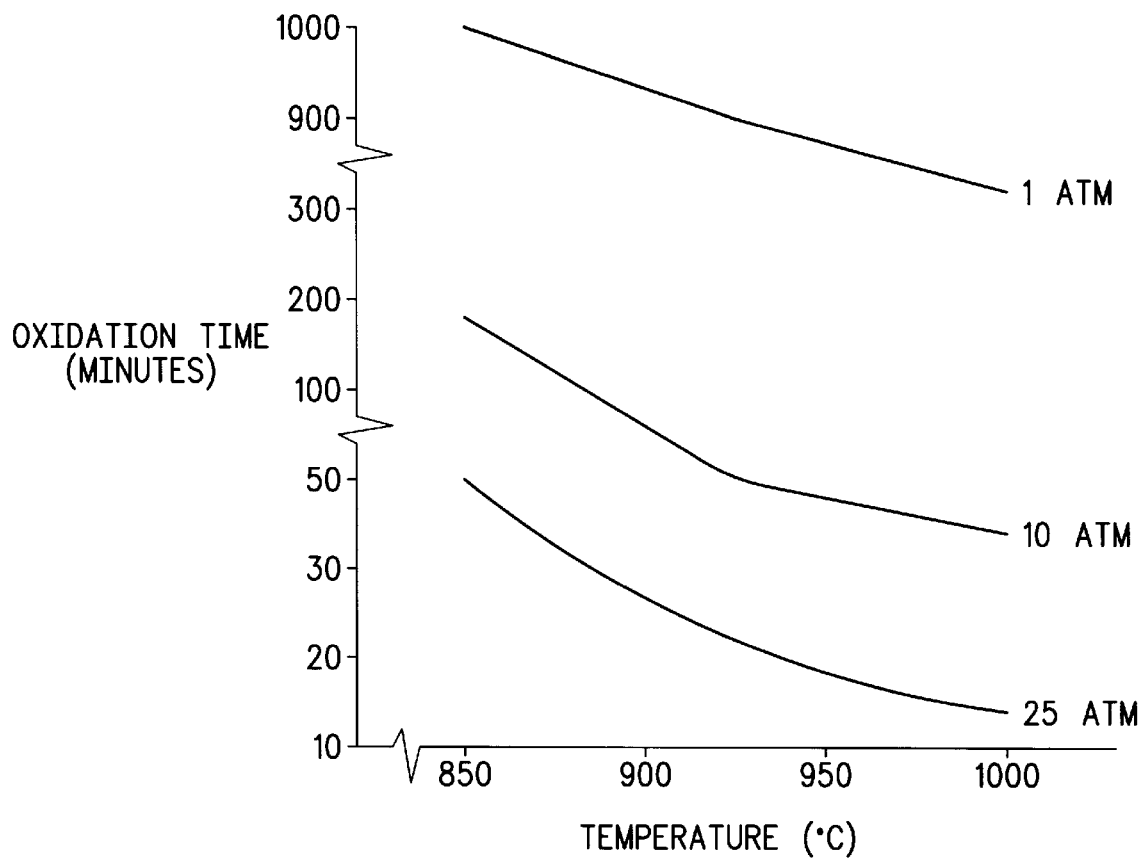
FIG. 1 illustrates relative oxidation times for a pure steam oxidation process with varying oxidation pressures.
Figure 2:
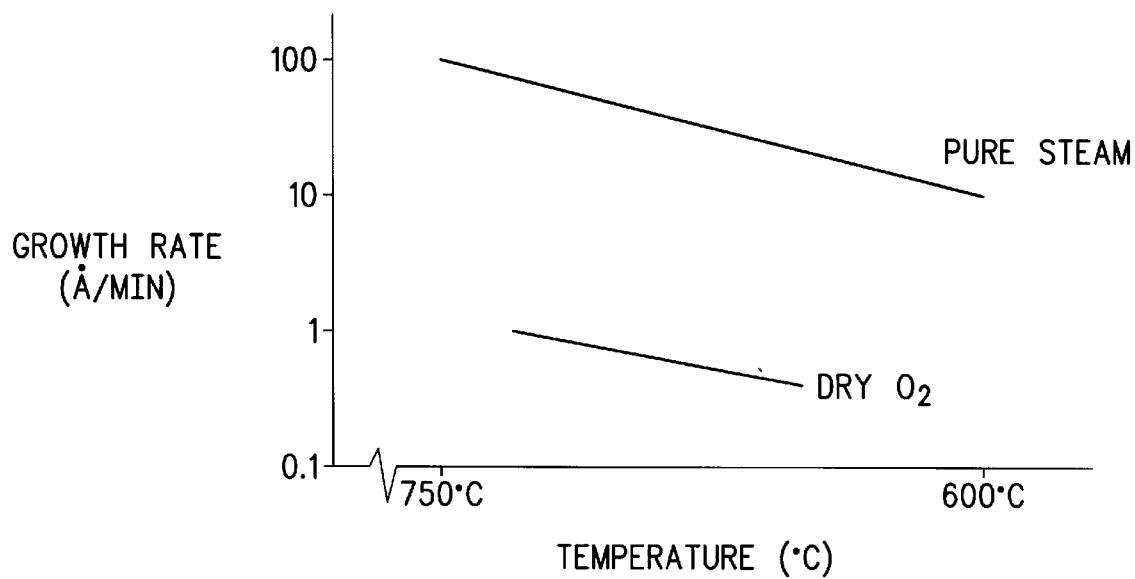
FIG. 2 illustrates relative oxide growth rates for a HiPOx process.

The present invention utilizes a high pressure process to form a dielectric layer on an underlying substrate. Commercially available HiPOx equipment, such as that made by GaSonics, may be used in practicing the invention. In a first method of the invention, a semiconductor wafer having a surface to be oxidized is placed inside the pressure vessel of the HiPOx system. The surface to be oxidized may be, but is not limited to, single crystal silicon, polycrystalline silicon, or nitride. An oxidation temperature substantially in a range of 600° C. to 1150° C. may be used, with a preferable processing range of 750° C. to 1000° C. A pressure greater than 1 atm is used. It is critical that the pressure is above atmospheric in order to take advantage of the parabolic increase in oxidation rate with increased pressure. Existing commercial HiPOx equipment typically allows a maximum pressure of 25 atm but this pressure may be increased with advances in processing equipment. In practicing the present invention, a preferred operating pressure is substantially in a range of 10 to 25 atm with the presently available commerical HiPOx equipment.

The method of the present invention utilizes both oxygen and steam as oxidants in the high pressure thermal oxidation process, with the oxygen flow being the predominant component of the oxidant. However, practicing the present invention is not limited in any way to the use of oxygen. Other oxidizing gases, such as nitrous oxide ($N_2O$) and nitric oxide (NO) may also be used. An oxygen flow rate substantially in a range of 10 to 20 liters/min is preferred, with a flow rate of 20 liters/min being typical. A flow of steam, approximately in a range of 0.005% to 20% of the oxygen flow with a preferred range of 0.005% to 0.05%, is added to the thermal oxidation process. An oxygen flow rate of 20 liters/min translates into steam flow rate in the preferred range of 1 to 10 $cm^3$/min as measured at 25° C. and 1 atm, otherwise referred to as standard cubic centimeter per minute (sccm). This minute flow of steam acts in a catalytic-like fashion to substantially increase the oxidation rate of the substrate surface over the dry oxygen process. However, the added steam flow is insignificant to generate dirty particles during oxidation. Moreover, the added steam is an insubstantial amount as compared to the pure steam process, that the Kooi effect is avoided. Furthermore, because the oxidation time and/or temperature can be significantly reduced, the present invention offers a dramatic improvement in thermal budget over the conventional 1 atm oxidation or the HiPOx dry oxygen process. Additionally, the method of the present invention allows a comparable thermal budget to the HiPOx pure steam process. It is possible to thermally oxidize a substrate surface to manufacturably form a dielectric layer substantially in a range of 50 Å to 20,000 Å within a reasonable amount of oxidation time. While the method of the present invention does not preclude the thermal oxidation of oxide layers thicker than 20,000 Å, it is expected that the method of the present invention is more practical in the thinner oxide ranges.

Figure 3:
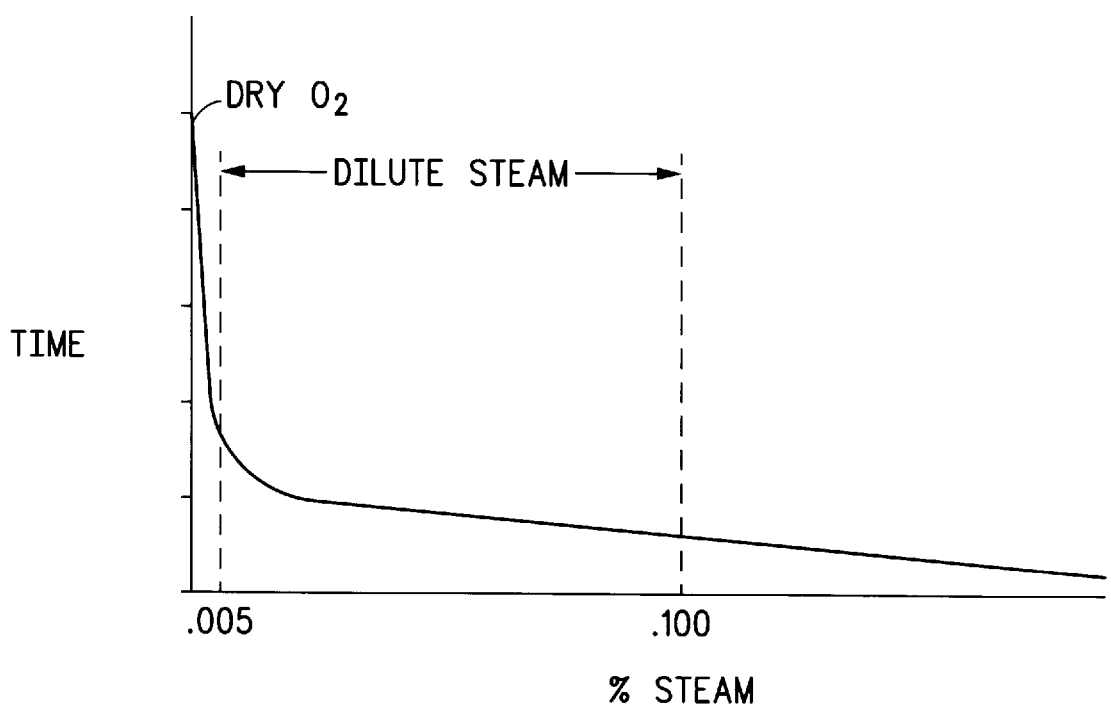
FIG. 3 illustrates an oxidation time curve for a dilute steam HiPOx process in accordance with the present invention.

As can be seen in FIG. 3, the most dramatic decrease in oxidation time for a given thickness is realized by the addition of a first few thousandths of a percent of superheated steam to an otherwise dry oxygen process. As the percentage of steam is increased, the rate of time gain is decreased, and the oxidation rate eventually approaches that of a pure steam process.

It has been found in a first experiment that an addition of 3 sscm of steam to an oxygen flow of approximately 20 liter/min, at an oxidation temperature of 1000° C. and pressure of 25 atm, reduced the required oxidation time by 67% (from 90 minutes to 30 minutes) for an oxide thickness of 5,000 Å.

A second experiment adding 5 sccm of steam to an oxygen flow of 20 liter/min at an oxidation temperature of 950° C. reduced the required oxidation time by 78% as compared to a dry oxygen process (from 90 minutes to 20 minutes) for the same oxide thickness. This result is particularly unexpected because in a standard 1 atm oxidation process, a reduction of 25° C. in oxidation temperature increases the required oxidation time by approximately 30 minutes. However, in the present process, a reduction of 50° C. in oxidation temperature at an elevated pressure did not result in a time increase but rather a decrease. A goal in the processing of silicon has been to optimize the trade-off between oxidation time and temperature while making the process relatively particle-free. With the present invention using dilute steam in a thermal oxidation process, however, such a trade-off is not required because one may decrease both oxidation time and temperature and still maintain a low thermal budget. If the desired oxidation temperature unduly decreases oxidation time, then the rate of steam addition may be increased to compensate because the steam flow has a dominant effect in terms of controlling oxidation rate.

Yet a third experiment adding 5 sccm of steam to an oxygen flow of 20 liter/min at an oxidation temperature of 1000° C. reduced the oxidation time by over 92% for an oxide thickness of 6750 Å. This means that for a thermal oxidation that would have required 90 minutes to complete in either a standard 1 atm steam process or a HiPOx dry oxygen process, this oxidation time can be reduced to approximately 7.5 minutes by practicing the present invention.

The foregoing description and illustrations contained herein demonstrate many of the advantages associated with the present invention. In particular, it has been revealed that the method of the present invention has none of the disadvantages of either the dry oxygen or pure steam HiPOx process or the conventional 1 atm oxidation process. The present invention offers significant decreases in cycle time as compared to either the dry oxygen HiPOx or the conventional 1 atm oxidation process. It produces a lower thermal budget than either of these two processes. An added benefit is that less lateral oxidation results because the oxidation time is significantly reduced. Practicing the present invention results in comparable thermal budgets as the pure steam HiPOx process with minimal dirty particles generation because the steam flow is so diluted with the oxygen flow such that the steam constitutes only a fraction of a percent of the oxidant flow. Additionally, the Kooi effect is effectively eliminated due to the significant reduction in water vapor during the oxidation process.

Thus it is apparent that there has been provided, in accordance with the invention, a method for forming a dielectric layer on a substrate using high pressure that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the invention may be practiced in forming LOCOS based isolation. In addition, the method of the present invention may be used in forming the bottom and top oxides of the oxide/nitride/oxide (ONO) structure. Furthermore, the invention may be utilized in forming gate oxides. It is also important to note that the present invention is not limited in any way to oxidation of single crystal silicon but may also be used to oxidize polysilicon or nitride. Therefore, it is intended that this invention encompass all such variations and modifications falling within the scope of the appended claims.

I claim:

1. A method for forming a dielectric layer on a surface of a substrate comprising the steps of:

heating a pressure vessel of a high pressure oxidation equipment;

placing the substrate inside the pressure vessel;

pressurizing the pressure vessel to a pressure of at least approximately 10 atmospheres;

introducing an oxidizing stream including an oxidizing gas and steam into the pressure vessel after the step of pressurizing, wherein the steam constitutes a fraction of a percent of the oxidizing stream but is at least approximately 0.005% steam; and forming the dielectric layer by oxidizing the surface of the substrate with the oxidizing stream, wherein the steps of introducing and forming are performed simultaneously for a time period of at least approximately 7.5 minutes.

2. The method of claim 1, wherein the step of heating heats the pressure vessel to a temperature substantially in a range of 600° C. to 1150° C.

3. The method of claim 1, wherein the step of pressurizing is performed such that the pressure is no greater than approximately 25 atmospheres.

4. The method of claim 1, wherein the step of introducing is performed such that the oxidizing gas is oxygen that flows into the pressure vessel at a rate substantially in a range of 10 liters/minute to 20 liters/minute.

5. The method of claim 1, wherein the step of introducing is performed such that the steam flows into the vessel at a rate substantially in a range of 1 $cm^3$/minute to 10 $cm^3$/minute.

6. The method of claim 1, wherein the step of introducing is performed such that the steam is in a range of approximately 0.005–0.1 percent of the oxidizing stream.

7. The method of claim 1, wherein the step of forming the dielectric layer is characterized as forming an oxide layer.

8. The method of claim 1, wherein the step of forming the dielectric layer is characterized as forming a dielectric layer having a thickness substantially in a range of 50 Å to 20,000 Å.

9. The method of claim 1, wherein the step of introducing is performed such that the oxidizing gas comprises a gas selected from a group consisting of oxygen, nitrous oxide, and nitric oxide.

10. The method of claim 1, wherein the steps of introducing and forming are performed simultaneously for no more than approximately 30 minutes.

11. A method for forming an oxide layer on a surface of a substrate comprising the steps of:

heating a pressure vessel of a high pressure oxidation equipment;

placing the substrate inside the pressure vessel;

pressurizing the pressure vessel to a pressure in a range of approximately 10–25 atmospheres;

introducing an oxidizing stream including an oxidizing gas and steam into the pressure vessel after the step of pressurizing, wherein the steam constitutes a fraction of a percent of the oxidizing stream but is at least approximately 0.005% steam; and thermally oxidizing the surface of the substrate with the oxidizing steam to form the oxide layer, wherein the steps of introducing and thermally oxidizing are performed simultaneously for a time period of at least approximately 7.5 minutes.

12. The method of claim 11, wherein the step of heating heats the pressure vessel to a temperature substantially in a range of 600° C. to 1150° C.

13. The method of claim 11, wherein the step of introducing is performed such that the steam is in a range of approximately 0.005–0.1 percent of the oxidizing stream.

14. The method of claim 11, wherein the step of introducing is performed such that the oxidizing gas flows at a rate substantially in a range of 10 liters/minute to 20 liters/minute and the steam flows at a rate substantially in a range of 1 $cm^3$/minute to 10 $cm^3$/minute.

15. The method of claim 11, wherein the step of introducing and thermally oxidizing are performed simultaneously for no more than approximately 30 minutes.

16. The method of claim 11, wherein the step of thermally oxidizing is performed such that the oxide layer has a thickness substantially in a range of 50 Å to 20,000 Å.

17. The method of claim 11, wherein the step of introducing is performed such that the oxidizing gas comprises a gas selected from a group consisting of oxygen, nitrous oxide, and nitric oxide.

18. A method for forming an oxide layer on a surface of a silicon substrate comprising the steps of:

placing the substrate inside a pressure vessel of a high pressure oxidation equipment;

heating the pressure vessel to a temperature substantially in a range of 750° C. to 1000° C.;

pressurizing the pressure vessel to a pressure substantially in a range of 10 atmospheres to 25 atmospheres; and introducing an oxidizing stream including an oxidizing gas and steam into the pressure vessel after the step of pressurizing, wherein:

the oxidizing gas is selected from a group consisting of oxygen, nitrous oxide, and nitric oxide;

the oxidizing gas flows at a rate substantially in a range of 10 liters/minute to 20 liters/minute; and the steam flows at a rate substantially in a range of 1 $cm^3$/minute to 10 $cm^3$/minute; and thermally oxidizing the surface of the silicon substrate with the oxidizing stream to form the oxide layer having a thickness in a range of approximately 5,000–20,000 Å thick, wherein the steps of introducing and thermally oxidizing are performed simultaneously for a time period of at least approximately 7.5 minutes.

19. The method of claim 18, wherein the step of introducing is performed such that the steam is in a range of approximately 0.005–0.1 percent of the oxidizing stream.

20. The method of claim 18, wherein the step of introducing and thermally oxidizing are performed simultaneously for no more than approximately 30 minutes.

* * * * *